United States Patent [19]

Chun

[11] Patent Number: 5,331,235
[45] Date of Patent: Jul. 19, 1994

[54] MULTI-CHIP SEMICONDUCTOR PACKAGE
[75] Inventor: Heung S. Chun, Seoul, Rep. of Korea
[73] Assignee: Goldstar Electron Co., Ltd., Rep. of Korea
[21] Appl. No.: 866,846
[22] Filed: Apr. 10, 1992
[30] Foreign Application Priority Data
  Jun. 1, 1991 [KR] Rep. of Korea ............... 9124/1991
[51] Int. Cl.$^5$ ............................................. H01L 23/16
[52] U.S. Cl. ..................................... 257/777; 257/723
[58] Field of Search ............... 257/685, 689, 723, 724, 257/728, 777, 779, 780, 781

[56] References Cited

U.S. PATENT DOCUMENTS

| | | | |
|---|---|---|---|
| 4,862,322 | 8/1989 | Bickford et al. | 257/723 |
| 4,982,265 | 1/1991 | Watanabe et al. | 257/777 |
| 5,010,387 | 4/1991 | Dunaway et al. | 257/779 |

OTHER PUBLICATIONS

"Development of Packages for Memory Which Enables to Enlarge the Capacity of 2-4 Times the Same Sizes as TSOP and SOJ", (Reliability is equal to the Conventional Package), Nikkei Micro Denies p. 80, Apr. 1991.

Primary Examiner—Rolf Hille
Assistant Examiner—S. V. Clark
Attorney, Agent, or Firm—Scully, Scott, Murphy & Presser

[57] ABSTRACT

A Multi-chip semiconductor package having the thinnest structure. The package includes a chip set including a first bare chip and a second bare chip which are connected to each other by solder interposed therebetween and a plurality of TAB tapes each having an inner lead and an outer lead, the first bare chip and the second bare chip being provided with a plurality of solder bumps at opposite sides of surfaces thereof facing to each other, each of the inner leads being bonded between each corresponding the solder bump of the first bare chip and each corresponding the solder bump of the second bare chip, and a lead frame bonded to the outer leads of the TAB tapes. The chip set of the multi-chip semiconductor package may be connected to other chip set so that the package has four bare chips. Therefore, the thinnest multi-chip semiconductor package can be achieved and an integration of the package is improved. Also, a chip set is formed by fixing lead frames between two bare chips, to render the chip sets stably and firmly stacked and the pads of each bare chip disposed at desired position.

6 Claims, 4 Drawing Sheets

MULTI-CHIP SEMICONDUCTOR PACKAGE

BACKGROUND OF THE INVENTION

1. Field of the Invention

The present invention relates to a multi-chip semiconductor package which has an improved integration by superposing several semiconductor chips, and more particularly to a multi-chip semiconductor package which is capable of having the thinnest structure by using a TAB technology (Tape Automated Bonding Technology) and a C-4 bonding technology.

2. Description of the Prior Art

Recently, a semiconductor package tends to be miniaturized, that is, be light and thin, while a bare chip gradually becomes larger in size so that an area or a volume ratio of the bare chip to an overall semiconductor package increases. Accordingly, a technology for manufacturing a semiconductor package is gradually converted from the conventional plastic packaging technology in which a chip is placed on a paddle to LOC (Lead-On-Chip) technology in which leads are placed on a chip. Also, a semiconductor package is usually equipped with one bare chip, but it is well known that a multi-chip semiconductor package is manufactured by superposing several chips in order to form a piggy-bag type package or by superposing several chips inside a semiconductor package (disclosed in the Nikkei Micro Devices, April, 1991).

Referring to FIG. 1, there is shown a perspective view representing a typical embodiment of a conventional multi-chip semiconductor package which has the piggy-big type. As shown in FIG. 1, a plurality of semiconductor packages 2 are superposed on the lowermost semiconductor package 1 and outer leads 2a attached to upper semiconductor packages 2 are bonded to outer leads 1a attached to the lowermost semiconductor package 1 in a conventional manner so that the outer leads 1a and 2a are electrically connected to the another. The outer leads 1a of the lowermost semiconductor package 1 are outwardly formed into a SOP (Small Outline Package) type and fitted in a memory module or a board level. Therefore, the conventional piggy-bag type of semiconductor package has an improved integration 3 dimensionally.

However, since the conventional semiconductor package is constructed such that the semiconductor packages 1 and 2 each of which was made separately are superposed, the conventional semiconductor package has disadvantage in that each semiconductor package increases in a thickness by an increased wire loop height owing to a wire bonding and a mold thickness of encapsulation epoxy resin, thereby causing the thickness of the whole semiconductor packages to inevitably increase.

On the other hand, referring to FIG. 2, there is shown a cross sectional view representing a construction of a conventional multi-chip semiconductor package in which upper and lower bare chips are laterally arranged in parallel to each other in a single semiconductor package.

With reference to FIG. 2, the manufacturing process of the multi-chip semiconductor package is described as follows. First, two bare chips 3 and 4 are connected to each other. Inner leads to TAB tapes 5 and 6 are bonded to bumps 8 provided at pad portions of the bare chips 3 and 4 by the TAB technology. Outer leads of the TAB tapes 5 and 6 are bonded to lead frames 9 and 9', respectively. Finally, a mold portion 10 enveloping the resulting chip assembly is formed by applying an epoxy resin. Accordingly, a single semiconductor package has two bare chips 3 and 4 therein, thereby improving the integration of the elements and miniaturizing the package, that is, allowing the package to be light and to be thin.

In addition, referring to FIG. 3, there is shown a cross sectional view representing another embodiment of conventional multi-chip semiconductor packages in which four bare chips 11, 12, 11a and 12a are embedded therein.

In a similar manner to that described in FIG. 2, the multi-chip semiconductor package shown in FIG. 3, is manufactured as follows. In the upper half part of the multi-chip semiconductor package, the upper and lower bare chips 11 and 12 are connected to each other. Inner leads of TAB tapes 15 and 16 are bonded to bumps 13 and 14 of the chips 11 and 12, respectively. The bumps 13 and 14 are provided at opposite ends of upper and lower surfaces of the chips 11 and 12, respectively. Outer leads of the TAB tapes 15 and 16 are bonded to lead frames 17 and 17', respectively. At the same time, in the lower half part of the multi-chip semiconductor package, an upper bare chip 11a and a lower bare chip 12a are connected to each other. Inner leads of TAB tapes 20 and 21 are bonded to bumps 18 and 19 provided at opposite ends of upper and lower surfaces of the upper and lower bare chips 11a and 12a. Outer leads of the TAB tapes 20 and 21 are bonded to the lead frames 17 and 17', respectively. Finally, a mold portion 22 enveloping the resulting chip assembly is formed as applying the encapsulation epoxy resin. Accordingly, a single semiconductor package has four bare chips 11, 12, 11a and 12a therein, thereby more improving its integration and more miniaturizing the package than that shown in FIG. 2.

However, in the above-mentioned multi-chip semiconductor packages shown in FIG. 2 and FIG. 3, since the inner leads of the TAB tapes 6 and 15, 16, 20, 21 are bonded to the bumps 7, 8 and 13, 14, 18, 19 provided at upper and lower surfaces of the bare chips 3, 4 and 11, 12, 11a, 12a, the heights H and H', the one between the upper TAB tape 5 and the lower TAB tape 6 and the other between the upper TAB tape 15 and the lower TAB tape 21, increase, thereby causing a thickness of the whole semiconductor packages to increase.

Also, since the numbers of the TAB tapes 5, 6 and 15, 16, 20, 21 increase, a manufacturing cost of the multi-chip semiconductor package increases and a complex process is obliged to be required for manufacturing the package.

In addition, since each inner lead bond (ILB) between the bare chips 3, 4, 11, 12, 11a, and 12a and the TAB tapes 5, 6, 15, 16, 20, and 21 is formed at an outer surface of the bare chips 3, 4, 11, 12, 11a, 12a, the multi-chip semiconductor packages are not proper for the LOC technology. Due to relatively short lengths of the TAB tapes 5, 6, 15 and 16, a bonding process of the inner lead bonds is complex and a handling thereof is not easy.

SUMMARY OF THE INVENTION

Therefore, it is an object of the invention to provide a multi-chip semiconductor package which is manufactured into the thinnest structure by a TAB technology and C-4 bonding technology suitable for a flip-chip method in order to miniaturize a semiconductor package, to use the LOC technology according to a size of a bare chip increases and to package two or four bare chips simultaneously.

In order to achieve the above object, a multi-chip semiconductor package according to the present invention includes a chip set having a first bare chip and a second bare chip which are connected to each other by a solder interposed therebetween and a plurality of TAB tapes each having an inner lead and an outer lead, the first and second bare chips being provided with a plurality of solder bumps at opposite sides of surfaces thereof facing to each other, each of the inner leads being bonded between corresponding solder bumps of the first and second bare chips, and a lead frame bonded to the outer leads of the TAB tapes.

BRIEF DESCRIPTION OF THE DRAWINGS

These and other objects, features and advantages of the present invention will become more apparent by the following detailed specification and drawings, in which.

DESCRIPTION OF THE PREFERRED EMBODIMENTS

Figure 1:
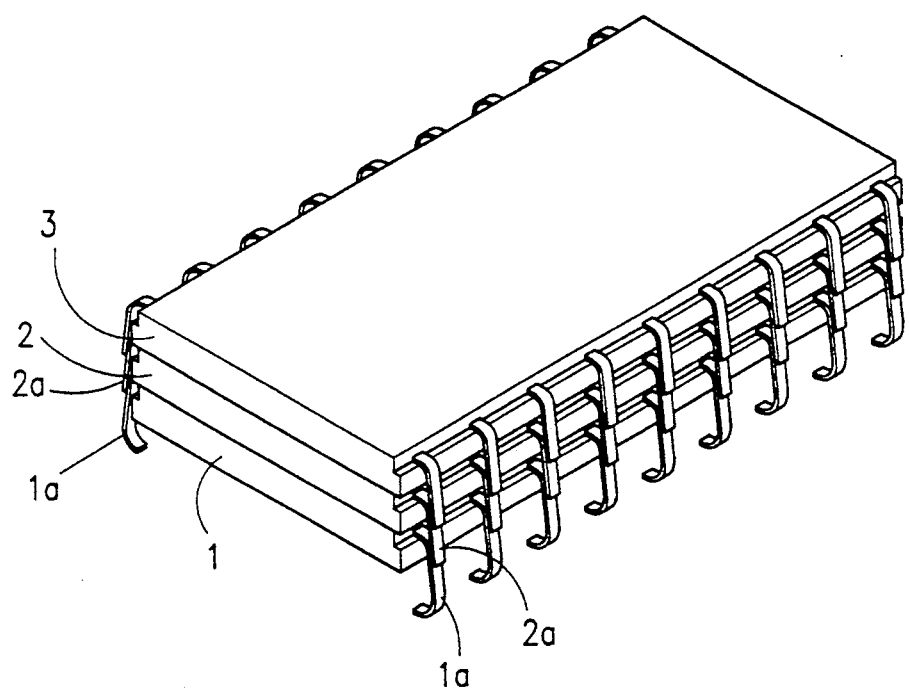
FIG. 1 is a perspective view representing a piggy-bag type of multi-chip semiconductor package according to the prior art.
Figure 2:
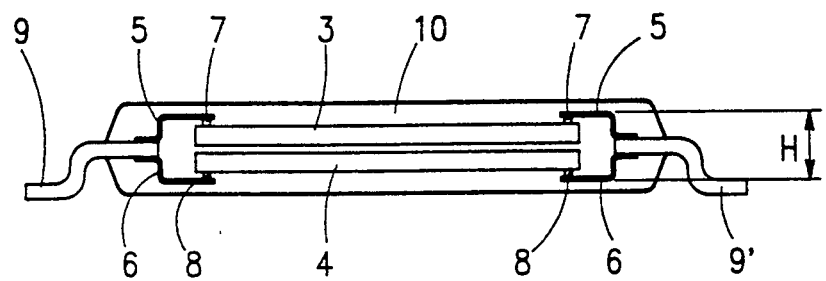
FIG. 2 is a cross sectional view of a TSOP type representing another embodiment of the multi-chip semiconductor package shown in the FIG. 1, in which two semiconductor chips are superposed therein.
Figure 3:
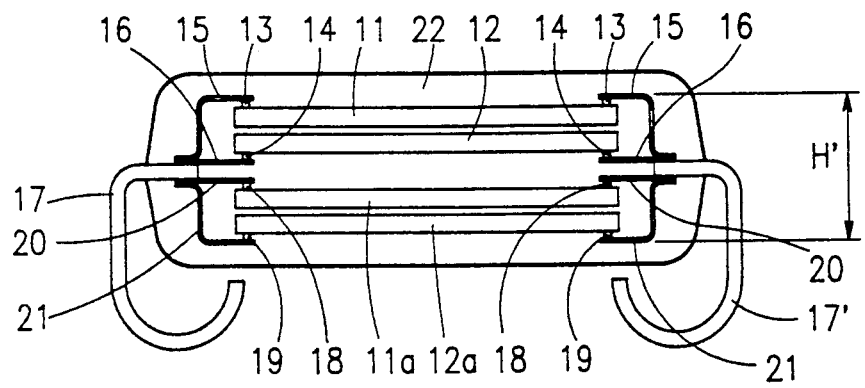
FIG. 3 is a cross sectional view of a TSOJ type representing still another embodiment of the multi-chip semiconductor package shown in the FIG. 1, in which four semiconductor chips are superposed therein.
Figure 4:
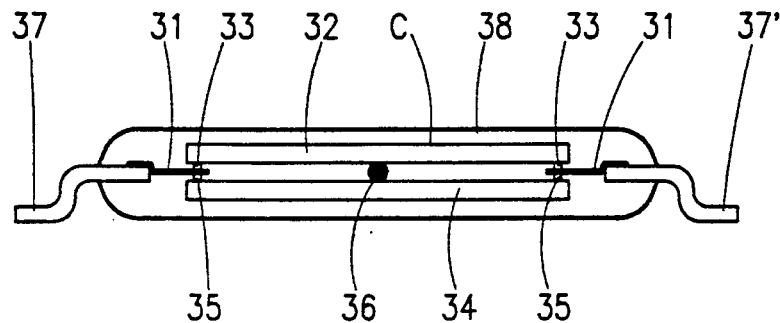
FIG. 4 is a cross-sectional view of a LOC-TSOP type representing an embodiment of the multi-chip semiconductor package where TAB leads are placed between two chips, according to the present invention.

Referring to FIG. 4, there is shown an LOC-TSOP (Thin Small Outline Package) representing an embodiment of a multi-chip semiconductor package according to the present invention. The multi-chip semiconductor package shown in the drawing includes upper and lower bare chips 32 and 34. The upper bare chip 32 is provided with solder bumps 33 at opposite sides of a lower surface thereof. Similarly, the lower bare chip 34 is provided with solder bumps 35 at opposite sides of an upper surface thereof. A solder 36 is interposed between the upper and lower bare chips 32 and 34 so that the chips 32 and 34 are connected to each other. Inner leads of TAB tapes 31 are bonded between the solder bumps 33 of the upper bare chip 32 and the solder bumps 35 of the lower bare chip 34 at opposite sides of either of the bare chips 32 and 34. Outer leads of TAB tapes 31 are bonded to a lead frame 37 (right in FIG. 4), 37' (left in FIG. 4), respectively (there are shown only two TAB tapes 31 and the associated components for easy understanding the structure of the package). The chip assembly as constructed above is enveloped with a mold portion 38.

A manufacturing process of the aforementioned multi-chip semiconductor package according to the present invention will be described hereinafter.

First, the inner leads of the TAB tapes 31 are bonded to the solder bumps 33 provided at opposite sides of a lower surface of the upper bare chip 32 by C-4 bonding. At this time, the inner leads of the tape 31 are first approximately aligned with respect to the solder bumps 33 of the chip 32, thereafter, the chip 32 and the tape 31 are received in a furnace so as to be heated, thereby causing the inner leads of the tape 31 to be self-aligned with respect to solder bumps 33 of the chip 32. Thus, the inner leads of the tape 31 are not required to be precisely aligned with respect to the solder bumps 33 differently from the prior art.

Thereafter, the separate lower bare chip 34 is overturned, then approximately aligned with respect to the inner leads of the tape 31 which has been connected to the solder bumps 33 of the upper chip 32, thereafter, heated so as to be connected to the inner leads of the tape 31 by the C-4 bonding. At this time, the lower chip 34 can be self-aligned with respect to the inner leads of the tape 31 so that there is not required to precisely align the lower chip 34 as described above. Sequentially, the solder 36 is interposed between the upper bare chip 32 and the lower bare chip 34.

In this case, since the TAB tape 31 which is provided with adhesive at both surfaces thereof is used, the TAB tape 31 functions as a polyimide cushion layer for the LOC package. After the inner leads of the TAB tapes 31 are bonded to the solder bumps 33 and 35, the bare chips 32 and 34 are subjected to a thermo-compression bonding to the connected to each other.

The upper and lower bare chips 32 and 34 which have been fixedly connected to each other and the TAB tapes 31 as described above result in a chip set C. After the chip set C is attached to a lead frame of a SOP (Small Outline Package) or a SOJ (Small Outline J-Lead Package), outer leads of the TAB tape 31 constituting the chip set C are bonded to lead frames 37 and 37', respectively, by the thermo-compression bonding. Thereafter, the result chip assembly is subjected to a mold encapsulation thereby forming a mold portion 38 surrounding the chip assembly.

If desired, a packaging cost for the multi-chip semiconductor package may be reduced by testing the chip assembly prior to bonding to the outer leads of the TAB tape 31 to the lead frames 37 and 37'.

As described hereinbefore, since the multi-chip semiconductor package according to an embodiment of the present invention is constructed such that the single TAB tape 31 is bonded to the upper bare chip 32 and the lower bare chip 34 simultaneously, it is possible to achieve the thinest LOC package and to multiply a package capacity by two.

Although the present invention has been described in case of the LOC-TSOP with a certain degree of particularity, it is to be understood that the invention is not limited to the specific embodiment thereof but can be applied to all kinds of semiconductor packages such as the LOC-SOJ type, the LOC-SOI type package, the LOC-SOP type.

Figure 5:
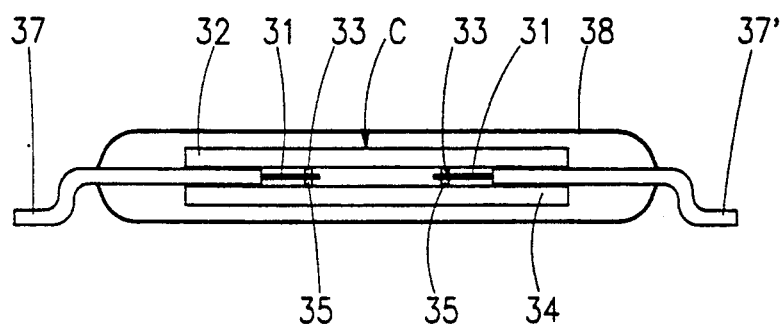
FIG. 5 is a cross sectional view of a LOC-TSOP type representing another embodiment of a multi-chip semiconductor package according to the present invention, where TAB leads are extended into the center of the chip.

Referring to FIG. 5, there is shown another embodiment of the present invention. The multi-chip semiconductor package includes upper and lower bare chips 32 and 34. Between the bare chips 32 and 34, lead frames 37 and 37' are inserted and fixed. Inner ends of the lead frames 37 and 37' are bonded with TAB tapes 34 so that leads of the TAB tapes 34 are connected to solder bumps 33 and 35 formed on the pads of the upper and lower bare chips 32 and 34. And, then the bare chips 32 and 34 are mold- encapsulated so that the other ends of the lead frames 37 and 37' are exposed outwardly.

In this embodiment of the present invention, leads of TAB tapes 31 which are bonded to the ends of the lead frames 37 and 37' are bonded to respective pads of the upper and lower bare chips 32 and 34 by the C-4 bonding which utilizes the solder bumps 33 and 35. Thereafter, the upper and lower bare chips 32 and 34 and the lead frames 37 and 37' inserted therebetween are bonded together so as to manufacture a chip set C and then the chip set C is mold-encapsulated with polyimide.

Thus, the gap between the bare chips 32 and 34 is held maintained by the lead frames 37 and 37', so that two bare chips can be firmly and stably stacked and a separate solder is not required. And, since lead frames 37 and 37' are fixed between two bare chips 32 and 34, it is possible to form the pads of bare chips not only at the peripheral portions of the bare chips, but also at the center or any desired portions of the bare chips.

Accordingly, it is possible to dispose the pads as desired, in the design of bare chip.

On the other hand, in case where a multiple number of bare chips are stacked, it also may be obtained by ramifying lead frames within the molding portion and inserting and fixing the ramified lead frames between the two bare chips.

Figure 6:
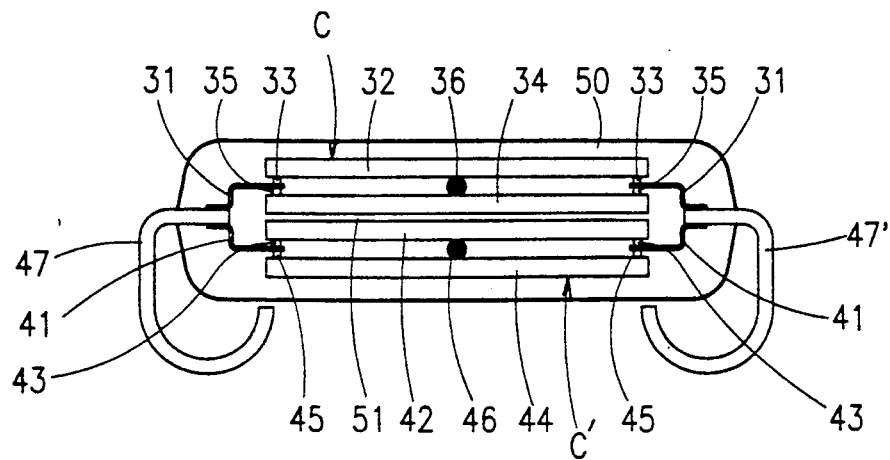
FIG. 6 is a cross sectional view of an LOC-TSOJ type representing another embodiment of a multi-chip semiconductor package shown in FIG. 4.
Figure 7:
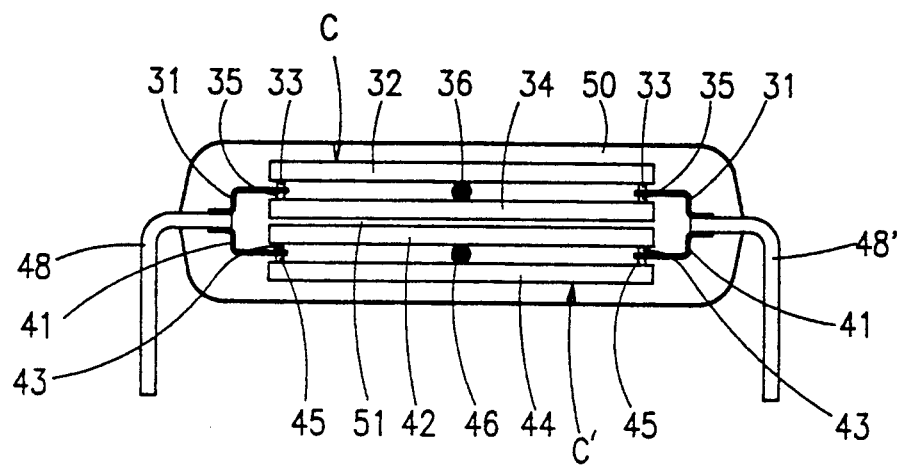
FIG. 7 is a cross sectional view of a butt type of multi-chip semiconductor package representing still another embodiment of a multi-chip semiconductor package shown in FIG. 4.
Figure 8:
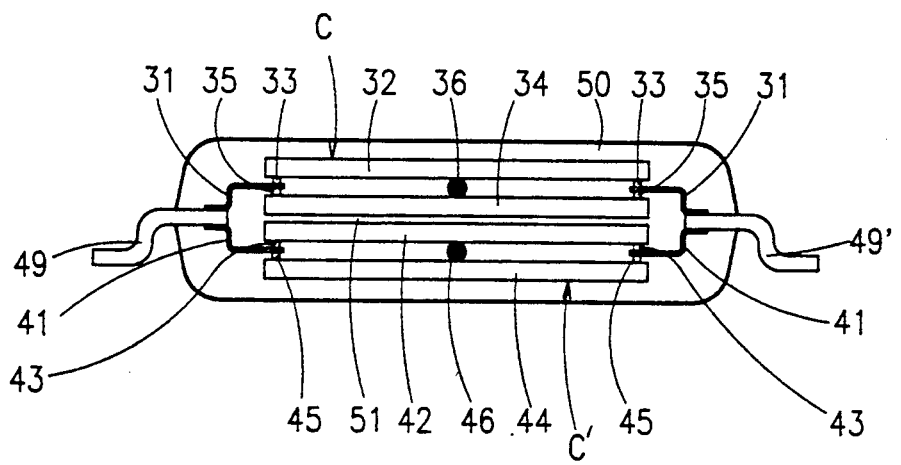
FIG. 8 is a cross sectional view of an LOC-TSOP type representing still another embodiment of a multi-chip semiconductor package shown in FIG. 4.

Referring to FIG. 6 to FIG. 8, there are shown multi-chip semiconductor packages according to another embodiment of the present invention in which four bare chips are superposed therein.

The multi-chip semiconductor package includes upper and lower chip sets C and C'. In a similar manner as illustrated in FIG. 4, the upper chip set C includes an upper bare chip 32 and a lower bare chip 34. The upper bare chip 32 is provided with solder bumps 33 at opposite sides of a lower surface thereof and the lower bare chip 34 is provided with solder bumps 35 at opposite sides of an upper surface thereof. Inner leads of a TAB tapes 31 are bonded between the solder bumps 33 and the solder bumps 35. The upper bare chip 32 and the lower bare chip 34 are fixedly connected to each other by a solder 36 interposed therebetween (there are also shown only two TAB tapes 31 and the associated components for easy understanding the structure of the package). Similarly, the lower chip set C' includes an upper bare chip 42 and a lower bare chip 44. The upper bare chip 42 is provided with solder bumps 43 at opposite sides of a lower surface thereof and the lower bare chip 44 is provided with solder bumps 45 at opposite sides of an upper surface thereof. Inner leads of TAB tapes 41 are bonded between the solder bumps 43 and 45. The upper bare chip 42 and the lower bare chip 44 are fixedly connected to each other by a solder 46 interposed therebetween. Lead frames 47, 47', 48, 48', 49, and 49' are bonded between outer leads of the TAB tapes 31 and outer leads of the TAB tapes 41. The upper chip set C adheres to the lower chip set C' by applying an adhesive 51 between the lower bare chip 34 of the upper chip set C and the upper bare chip 42 of the lower chip set C'. The chip assembly as structured above is enveloped with mold portion 50.

A manufacturing process of the aforementioned multi-chip semiconductor package according to another embodiment of the present invention which has four bare chips 32, 34, 42 and 44 will be described hereinafter.

First, in a similar manner as illustrated in FIG. 4, the inner leads of the TAB tapes 31 are bonded between the solder bumps 33 provided at opposite sides of a lower surface of the upper bare chip 32 and the solder bumps 35 provided at opposite sides of an upper surface of the lower bare chip 34 by C-4 bonding. At the same time, a solder 36 is interposed between the upper bare chip 32 and the lower bare chip 34 so as to fixedly connect the upper bare chip 32 to the lower bare chip 34. The upper and lower bare chips 32 and 34 which have been fixedly connected to each other and the TAB tape 31 as described above result in an upper chip set C.

Similarly to the upper chip set C, the inner leads of the TAB tapes 41 are bonded between the solder bumps 43 provided at opposite sides of a lower surface of the upper bare chip 42 and the solder bumps 45 provided at opposite sides of an upper surface of the lower bare chip 44 by C-4 bonding. At the same time, a solder 46 is interposed between the upper bare chip 42 and the lower bare chip 44 so as to fixedly connect the upper bare chip 42 to the lower bare chip 44. Therefore, it is accomplished to prepare the lower chip set C'.

Thereafter, outer leads of the TAB tapes 41 constituting the lower chip set C' are bonded to lower surfaces of the lead frames 47, 47', 48, 48', 49, and 49'. The adhesive 51 is applied to an upper surface of the upper bare chip 42 constituting the lower chip set C'. Then, the upper chip set C is placed to the upper bare chip 42 of the lower chip set C' and the outer leads of the TAB tapes 31 constituting the upper chip set C are bonded to upper surface of the lead frames 47, 47', 48, 48', 49, and 49' by a thermo-compression bonding. The resulting chip assembly having the four bare chips 32, 34, 42 and 44 is subjected to a mold encapsulation, thereby forming a mold portion 50 surrounding the chip assembly. The lead frame protruded from the mold portion 50 may have an LOC-SOJ type 47, 47' (FIG. 5), a LOC-SOI type 48, 48' (FIG. 6) or an LOC-SOP type 49, 49' (FIG. 7).

As apparent from the above description, since the multi-chip semiconductor package according to the present invention is constructed such that two bare chips are bonded to one TAB tapes or four bare chips to two TAB tapes, the number of the TAB tapes required for packaging can be reduced by half. Therefore, it is possible to make the thinnest multi-chip semiconductor package, thereby simplifying a manufacturing process of the package and reducing a manufacturing cost.

It is further understood by those skilled in the art that various changes and modifications may be made in the invention without departing from the spirit and scope thereof.

What is claimed is:

1. A multi-chip semiconductor package comprising:
   at least one chip set including first and second semiconductor chips each having a first face and a second face with said first face of the said first chip facing said first face of said second chip, said first face of said first and second chips having first and second solder bumps formed thereon;

first and second TAB tapes each having an inner lead and an outer lead wherein said inner lead of said first and second tapes is disposed between said first and second chips and bonded between said first solder bump on said first and second chips and said second solder bump on said first and second chips, respectively;

a solder bonded between and connected to said first face of said first and second chips; and first and second beam leads of a lead frame bonded to the outer leads of the first and second TAB tapes, respectively.

2. A multi-chip semiconductor package according to claim 1, wherein said package comprises first and second chip sets and said second face of said second chip of the first chip set faces the second face of the first chip of the second chip set, each outer lead of said first chip set and each corresponding outer lead of said second chip set is bonded to said first and second beam leads of the lead frame.

3. A multi-chip semiconductor package according to claim 1, wherein an adhesive is applied between said chips of the chip sets which are adjacent to each other.

4. A multi-chip semiconductor package according to claim 1, wherein said outer leads of the TAB tape are bonded to the small outline J-lead package type of lead frame.

5. A multi-chip semiconductor package according to claim 1, wherein said outer leads of the TAB tape are bonded to a small outline I-lead package type of lead frame.

6. A multi-chip semiconductor package according to claim 1, wherein said outer leads of the TAB tape are bonded to the small outline package type of lead frame.

* * * * *

UNITED STATES PATENT AND TRADEMARK OFFICE
CERTIFICATE OF CORRECTION

PATENT NO. : 5,331,235
DATED : July 19, 1994
INVENTOR(S) : Heung Sup Chun

It is certified that error appears in the above-indentified patent and that said Letters Patent is hereby corrected as shown below:

On the Title Page, Section [54]: "MULTI-CHIP SEMICONDUCTOR PACKAGE" should read --MULTI-CHIP SEMICONDUCTOR PACKAGE HAVING REDUCED THICKNESS--

Column 1, line 1: after "PACKAGE" insert --HAVING REDUCED THICKNESS--

Column 1, line 33: "big" should read --bag--

Column 1, line 65: "to" should read --of--

Column 8, lines 4, 7, 11 & 15, Claims 3, 4, 5 & 6: "claim 1" should read --claim 2--

Signed and Sealed this

Sixth Day of December, 1994

Attest:

BRUCE LEHMAN

Attesting Officer      Commissioner of Patents and Trademarks